(12) United States Patent
Hurwitz et al.

(10) Patent No.: US 8,866,286 B2
(45) Date of Patent: Oct. 21, 2014

(54) SINGLE LAYER CORELESS SUBSTRATE

(71) Applicant: Zhuhai Advanced Chip Carriers & Electronic Substrate Technologies Co. Ltd., Zhuhai (CN)

(72) Inventors: Dror Hurwitz, Zhuhai (CN); Shih-Fu Alex Huang, Qianwu (CN); Xianming Chen Simon Chan, Qianwu (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 0 days.

(21) Appl. No.: 13/713,550

(22) Filed: Dec. 13, 2012

(65) Prior Publication Data
US 2014/0167234 A1 Jun. 19, 2014

(51) Int. Cl.
*H01L 23/04* (2006.01)
*H01L 23/00* (2006.01)
*H01L 23/495* (2006.01)

(52) U.S. Cl.
CPC ... *H01L 23/4952* (2013.01); *H01L 2224/48091* (2013.01); *H01L 24/81* (2013.01); *H01L 24/85* (2013.01)
USPC .......................................... 257/698; 257/787

(58) Field of Classification Search
USPC ................................... 257/700, 701, 787, 698
See application file for complete search history.

(56) References Cited

U.S. PATENT DOCUMENTS

| | | | |
|---|---|---|---|
| 7,635,641 B2 | 12/2009 | Hurwitz et al. | |
| 7,669,320 B2 | 3/2010 | Hurwitz et al. | |
| 7,682,972 B2 | 3/2010 | Hurwitz et al. | |
| 2008/0315398 A1* | 12/2008 | Lo et al. | 257/693 |
| 2012/0287583 A1* | 11/2012 | Pressel et al. | 361/728 |
| 2013/0075921 A1* | 3/2013 | Chen et al. | 257/774 |

OTHER PUBLICATIONS

Furukawa Review, "Ultra Thin Copper Foil with Carrier Foil," No. 38, 2010.

\* cited by examiner

*Primary Examiner* — S. V. Clark
(74) *Attorney, Agent, or Firm* — Wiggin and Dana LLP; Gregory S. Rosenblatt; Jonathan D. Hall

(57) ABSTRACT

An electronic chip package comprising at least one chip bonded to a routing layer of an interposer comprising a routing layer and a via post layer that is surrounded by a dielectric material comprising glass fibers in a polymer matrix, wherein the electronic chip package further comprises a second layer of a dielectric material encapsulating the at least one chip, the routing layer and the wires, and methods of fabricating such electronic chip packages.

29 Claims, 2 Drawing Sheets

SINGLE LAYER CORELESS SUBSTRATE

BACKGROUND

1. Field of the Invention

The present invention relates to electronic chip packaging and to methods of manufacturing of same.

2. Description of the Related Art

Consumer electronics such as computing and telecommunication devices include integrated circuit chips. These require IC substrates as part of the chip packaging.

The IC substrates are required to have high planarity and to be stiff and warp resistant to ensure good contact with underlying substrates. The general requirement for such support structures is reliability and appropriate electrical performance, thinness, stiffness, planarity, good heat dissipation and a competitive unit price.

A well established common type of chip package that is comparatively cheap and enables IC circuits to communicate with the outside world is the lead frame. The lead frame uses metal leads that extend outside the housing. Lead frame technology goes back to the early days of DIP chips, but is still widely used in many package varieties.

The lead frame serves as the 'skeleton' of the IC package, providing mechanical support to the die during its assembly into a finished product. It consists of a die paddle, to which the die is attached, and leads, which serve as the means for external electrical connection to the outside world. The die is connected to the leads by wires through wire bonding or by tape automated bonds.

Once attached to the lead frame with the connecting wires, the die or chip is covered with a molding compound, which is a plastic protective material.

Other technologies that are used for fabricating more advanced multilayer substrates comprise layers of connecting pads or features within dielectric material. Vias are provided through the dielectric material to couple features in different layers.

One method for fabricating such vias is by drill & fill, wherein holes are drilled through the dielectric, typically using a laser, and a conductive material, such as copper is used to fill the hole, creating a via.

An alternative approach is to fabricate vias by depositing copper or other metal into a pattern created in a photo-resist, using a technology known as 'pattern plating'. The photo-resist is then removed and the upstanding via posts are laminated with a dielectric material that is preferably a polymer impregnated glass fiber mat prepreg for enhanced stiffness.

In pattern plating, a seed layer is first deposited. Then a layer of photo-resist is deposited thereover and subsequently exposed to create a pattern which is selectively removed to make trenches that expose the seed layer. Via posts are created by depositing copper into the trenches in the photo-resist. The remaining photo-resist is then removed, the seed layer is etched away, and a dielectric material that is, again, typically a polymer impregnated glass fiber mat prepreg, is laminated thereover and therearound to encase the vias posts. Various techniques and processes can be then use to thin down the dielectric material, planarizing it and exposing the tops of the via posts allowing conductive connection to a ground or reference plane thereby, for building up the next metal layer thereupon. Subsequent layers of metal conductors and via posts may be deposited thereonto, by repeating the process to build up a desired multilayer structure.

In an alternative but closely linked technology, known hereinafter as 'panel plating', a continuous layer of metal or alloy is deposited onto a substrate. A layer of photo-resist is deposited on top of this and a pattern is developed therein, and the pattern of developed photo-resist is stripped away, selectively exposing the metal thereunder, which may then be etched away. The undeveloped photo-resist protects the underlying metal from being etched away, and leaves a pattern of upstanding features and vias. After stripping away the undeveloped photo-resist, a dielectric material, such as a polymer impregnated glass fiber mat, may be laminated around and over the upstanding copper features and/or via posts.

The via layers created by pattern plating or panel plating methodologies such as those described above, are typically known as 'via posts'. Feature layers may be fabricated using similar techniques.

One flexible technology for fabricating high density interconnects is to build up pattern or panel plated multilayer structures consisting of metal vias or features in a dielectric matrix. The metal may be copper, and the dielectric may consist of a fiber reinforced polymer matrix. Typically, a polymer with a high glass transition temperature (Tg) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd. For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures. The method includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

Multilayer substrates enable a higher density of connections and are used with ever more sophisticated IC chips. They are more expensive than simple single layer lead frames, and for many electronic applications, the more economical lead frame is suitable.

Lead frame technology has several limitations though. The chip is attached to the lead frame by wire bonding and the longer the connecting wires, the greater the danger of a wire breaking, creating a disconnect and leading to failure. Additionally, the closer the wires are packed together, the greater the likelihood of shorting.

The via post in dielectric material approach is suitable for multilayer substrates but is generally too flimsy to be used in single layers, it being appreciated that warping and bending create poor contacts, unreliability and shorting.

Embodiments of the present invention address these problems.

BRIEF SUMMARY

Embodiments of the present invention are directed to providing novel chip packaging solutions.

An electronic chip package comprising at least one chip bonded to a routing layer of an interposer comprising a routing layer and a via post layer, wherein the via post layer is surrounded by a dielectric material comprising glass fibers in a polymer resin, and the chip and routing layer are embedded in a second layer of dielectric material encapsulating the chip and the routing layers.

In some embodiments, the electronic chip package further comprises a metallic sacrificial base on an opposite side of the via post layer from the routing layer.

In some embodiments, at least one via post in the via post layer has a non-cylindrical shape characterized by having a long dimension in the X-Y plane that is at least 3 times as long as the short dimension in the X-Y plane.

In some embodiments, an underside of the interposer comprises copper ends of via posts surrounded with the dielectric material such that the copper ends of the via posts are flush with the dielectric material.

In other embodiments, an underside of the interposer comprises copper ends of via posts surrounded with the dielectric material such that the copper ends of the via posts are recessed by up to 5 microns with respect to the dielectric material.

In other embodiments, the electronic chip package further comprises copper via posts and a barrier metal layer covering ends of the via posts distanced from the routing layer such that an underside of the interposer comprises ends of via posts comprising barrier metal surrounded with the dielectric material such that the barrier metal ends of the via posts are flush with the dielectric material.

Typically the barrier metal layer is selected from the group consisting of Nickel, Gold, Tin, Lead, Palladium, Silver and combinations thereof.

In some embodiments, the via barrier metal layer has a thickness in a range of from 1 micron to 10 microns.

In some embodiments, the at least one chip is configured as a flip-chip that is bonded by an array of bumps to the routing layer.

In some such embodiments, the second layer of dielectric is a glass fiber reinforced polymer.

Typically, the at least one chip is bonded to the routing layer by wire bonds and the second layer of dielectric is a molding compound.

Optionally, the first layer of dielectric surrounding the via posts comprises a first polymer resin and the second layer of dielectric material surrounding the routing layer and the at least one chip comprises a second polymer resin, wherein the first polymer resin is different from the second polymer resin.

Optionally, the first layer of dielectric surrounding the via posts comprises inorganic fillers.

Optionally, the polymer resin of the first layer of dielectric surrounding the via posts is selected from the group consisting of polyimide, epox-y, BT (Bismaleimide/Triazine), Polyphenylene Ether (PPE), Polyphenylene Oxide (PPO) and their blends.

A second aspect is directed to providing a method for fabricating an electronic chip package comprising the steps of:
(a) selecting a sacrificial substrate;
(b) depositing an etchant resistant barrier layer onto said sacrificial substrate;
(c) plating a layer of via posts;
(d) laminating the layer of via posts with a dielectric material;
(e) thinning and planarizing the dielectric layer;
(f) plating a layer of routing features over the via layer;
(g) attaching at least one chip, and
(h) encapsulating the at least one chip and routing features with a second dielectric material.
(i) removing the sacrificial substrate, and
(j) removing barrier layer.

In some embodiments, step (g) comprises wire bonding the at least one chip to the routing features and step (h) comprises encapsulating the at least one chip and routing features with a molding material.

In some embodiments, step (g) comprises flip chip bonding the at least one chip to the routing features with an array of bumps.

Optionally in such embodiments, step (h) comprises encapsulating with a glass fiber in polymer pre-preg.

In some embodiments, the sacrificial substrate comprises a peelable copper substrate, a release layer and an ultra fine copper foil, and step (i) of removal of the sacrificial substrate comprises peeling away the peelable copper substrate and etching away the remaining copper foil.

In some embodiments, the sacrificial substrate comprises a copper clad laminate, and step (i) of removal of the sacrificial substrate comprises etching away the copper.

In some embodiments, the method further comprises the step (k) of terminating the substrate by removing the etchant resistant barrier layer to expose ends of vias on outer surfaces of the stack and applying terminations to said ends of vias.

In some embodiments, the barrier layer of step (b) is deposited to a thickness in the range of 0.1 micron to tens of microns and either:
  comprises a metal selected from the list of tantalum, tungsten, titanium, titanium-tantalum alloy, titanium-tungsten alloy, nickel, tin, lead, and tin-lead alloy and said depositing comprises sputtering, or
  comprises a metal selected from the list of nickel, tin, lead, and tin/lead alloy and said depositing is by a process selected from the list of electroplating and electro-less plating.

In some embodiments, the step (c) of plating a layer of via posts comprises pattern plating said layer of via posts by the sub-steps of:
  laying down a layer of photo-resist;
  developing a pattern of vias in said layer of photo-resist;
  plating copper into said pattern, and
  stripping away the photo-resist leaving said vias upstanding.

In some embodiments, step (c) of plating a layer of via posts comprises depositing a termination material and building via posts by onto said termination material.

In some embodiments, the termination metal comprises at least of the group consisting of tin, tin-lead alloy, gold, silver and palladium.

In some embodiments, step (c) of plating a layer of via posts comprises panel plating said layer of via posts by the sub-steps of:

panel plating a continuous layer of copper;
    depositing a layer of photo-resist over said continuous layer of copper;
    developing a pattern of vias in said layer of photo-resist;
    etching away surplus copper to leave said pattern, and
    stripping away the developed photo-resist leaving said vias upstanding.

In some embodiments, the first dielectric material comprises a polymeric resin selected from the group consisting of Teflon, derivatives of Teflon, bismaleimide triazine resins, epoxy resins, polyimide resins, Polyphenylene Ether (PPE), Polyphenylene Oxide (PPO) and mixtures thereof.

In some embodiments, the first dielectric material further comprise at least one of:
(a) inorganic particulate fillers having mean particle size of between 0.5 microns and 30 microns and between 15% and 30% of particulate by weight;
(b) fibers selected from the list of organic fibers and glass fibers, arranged in an arrangement selected from the list of cross-plied arrangements, woven mats and randomly oriented chopped fibers.

In some embodiments, step (d) of laminating the layer of via posts with a dielectric material comprises applying a pre-preg comprising glass fibers in a matrix selected from the group consisting of polyimide, epox-y or BT (Bismaleimide/Triazine), Polyphenylene Ether (PPE), Polyphenylene Oxide (PPO) or their blends, and curing by hot press laminating the pre-preg over the vias.

In some embodiments, the second dielectric material comprises a polymeric resin selected from the group consisting of Teflon, derivatives of Teflon, bismaleimide triazine resins, epoxy resins, polyimide resins, Polyphenylene Ether (PPE), Polyphenylene Oxide (PPO) and mixtures thereof.

In some embodiments, the second dielectric material further comprise at least one of:
(a) inorganic particulate fillers having mean particle size of between 0.5 microns and 30 microns and between 15% and 30% of particulate by weight;
(b) fibers selected from the list of organic fibers and glass fibers, arranged in an arrangement selected from the list of cross-plied arrangements, woven mats and randomly oriented chopped fibers.

In some embodiments, step (h) of laminating the layer of via posts with a dielectric material comprises applying a pre-preg comprising glass fibers in a matrix selected from the group consisting of polyimide, epox-y or BT (Bismaleimide/Triazine), Polyphenylene Ether (PPE), Polyphenylene Oxide (PPO) or their blends, and curing by hot press laminating the pre-preg over the chip and routing layers.

In some embodiments, step (e) of thinning and planarizing the dielectric layer comprises a process selected from the group consisting of dry etching, mechanical grinding, chemical mechanical polishing CMP, combinations and two stage processes thereof.

In some embodiments, step (f) of plating a layer of routing features over the via layer comprises either:
(i) panel plating copper over the dielectric layer, laying down a layer of photo-resist thereover, developing a positive pattern of routing features, selectively etching away superfluous copper leaving the routing features and stripping away the photo-resist, or
(ii) laying down a layer of photo-resist, developing a pattern of trenches, pattern plating routing features into said trenches, and stripping away the photo-resist.

In some embodiments, step (f) further comprises a preliminary step of depositing an adhesion metal layer onto the thinned dielectric material.

In some embodiments, the adhesion metal layer is selected from the group consisting of titanium, chrome, tungsten, nickel-chrome alloy and titanium-tungsten alloy.

In some embodiments, step (g) of attaching the at least one chip comprises applying solder.

In some embodiments, step (g) of attaching the at least one chip to the routing features comprises extending gold, aluminum or copper wires from said chip to said routing features.

In some embodiments, step (i) of removing the sacrificial substrate, comprises etching away the copper.

In some embodiments, step (i) of removing the sacrificial substrate, comprises peeling away a first copper layer and etching away remaining copper.

In some embodiments, step (i) of etching away the sacrificial substrate uses a wet etch process, and the etchant resistant barrier layer fabricated in step (b), acts as an etch stop.

In some embodiments, the barrier layer fabricated in step (b) comprises tantalum and the etch process for step (i) of etching away the sacrificial substrate comprises exposing the sacrificial substrate to a solution of ammonium hydroxide at an elevated temperature.

In some embodiments, the etchant resistant barrier layer fabricated in step (b) is selected from the group consisting of tantalum, titanium and tungsten, and titanium-tungsten alloy and step (j) of removing etchant resistant barrier layer comprises plasma etching uses a mixture of $CF_4$ and argon, wherein the mixture typically has a $CF_4$ to argon ratio of between 1:1 and 3:1.

In some embodiments, the etchant resistant barrier layer fabricated in step (b) is selected from the group consisting of tantalum, titanium, tungsten and titanium-tungsten alloy and step (j) of removing etchant resistant barrier layer comprises plasma etching uses a mixture of $CF_4$ and oxygen.

In some embodiments, the method further comprises applying a final coating to exposed ends of the vias selected from the group consisting of nickel, gold, tin, lead, silver, palladium and alloys thereof and organic anti-tarnish finishes.

The term microns or μm refers to micrometers, or 10-6 m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

Like reference numbers and designations in the various drawings indicated like elements.

DETAILED DESCRIPTION

In the description hereinbelow, support structures consisting of metal vias in a dielectric matrix, particularly, copper via posts in a polymer matrix, such as polyimide or epox-y or BT (Bismaleimide/Triazine), Polyphenylene Ether (PPE), Polyphenylene Oxide (PPO) or their blends, reinforced with glass fibers are considered.

Figure 1:
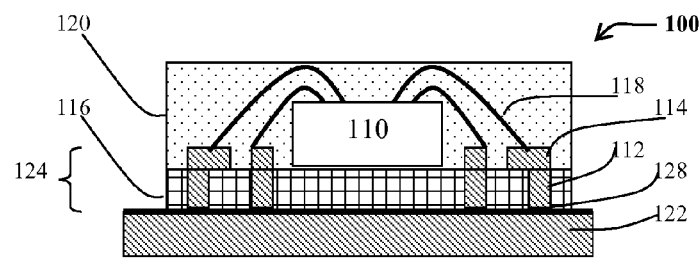
FIG. 1 is a simplified section through an electronic chip package in accordance with one embodiment of the invention.

With reference to FIG. 1, a schematic illustrative cross-section through an ultra-thin electronic chip package is shown. Ultra-thin chip package 100 comprises one or more chips 110 coupled by a layer of copper routing features 114 to copper via posts 112 in a dielectric material 116 surround consisting of a polymer matrix reinforced with glass fibers. The chip 110 may be wire bonded to the layer of routing features 114 with wire bonds 118, typically gold wires, and the ultra-thin chip package 100 further comprises a molding material 120 encapsulating the chip 110, routing features 114 and wire bonds 118.

The ultra-thin chip package 100 is fabricated on a sacrificial substrate 122, typically copper or a copper alloy, and only once the chip 112 is bonded to the interposer 124, i.e. the routing layers 114 and vias 112, and encapsulated with the molding material 120, the sacrificial substrate 122 may be removed.

By virtue of this unique configuration, where the chip 110 and molding material 120 provide bulk and thereby provide stiffness to a very thin interposer 124 that comprises a single layer of vias 112, a very thin chip package is achievable. Indeed Chip Scale Packaging CSP is achievable. Such packages are cost effective, high performance replacements for small-outline integrated circuit SOIC, quad-flat no-leads QFN and two layer chip scale packages 2L CSP.

As shown, the chip 110 is attached to the polished and thinned via layer. The configuration proposed is thinner than multilayer substrates but is not suitable for very high density large numbers of interconnects. Nevertheless, unlike traditional lead frame packages, by using a routing layer 114, it is possible to provide short wire bonds 118, and to avoid long wire bonds which have a tendency to snap. Also, wire bonding is generally achieved with gold wires, and the routing layer is copper. Thus, although the actual interposer 124 is typically more expensive than a conventional lead frame, such an ultra-thin chip package 100 may be cost-effective when the full packaging cost per chip 110 is considered. Furthermore, it will be appreciated that two or more chips 110 may be mounted side by side on a common interposer 124.

Figure 2:
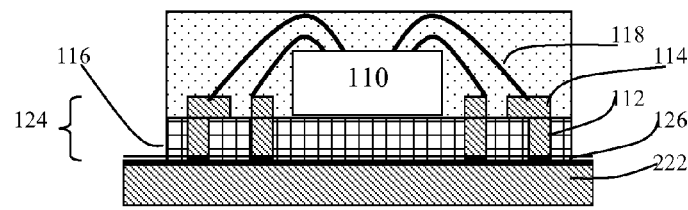
FIG. 2 is a simplified section through an electronic chip package in accordance with a second embodiment of the invention.

In the configuration of FIG. 2, the sacrificial substrate 222 comprises a commercially available peelable copper substrate, a release layer and an ultra-fine copper foil. Furukawa supply such foils commercially as F-DP and H-DP see Furukawa Review 38, 2010. http://www.furukawa.co.jp/review/fr038/fr38_06.pdf for more details.

Use of such film enables most of the substrate 222 to be peeled away, and only requires etching away a relatively thin layer of copper, typically 2 to 5 microns of copper 222 to expose the etch barrier layer 126 at the ends of the via posts 112. This may be achieved in a conventional chip packaging plant. Alternatively, the substrate fabricating plant may attach the chips 110 to the interposer 124 and encapsulate in an interesting vertical integration.

Another candidate substrate is a copper clad laminate CCL, such as widely used for fabricating printed circuit boards.

To enable the copper substrate to be etched away without damaging the ends of the via posts, in some embodiments, the deposition of the via posts which are generally copper starts with deposition of a barrier layer 126 of an etch resistant material such as tantalum, tungsten, titanium, titanium-tantalum alloy, titanium-tungsten alloy, nickel, tin, lead or tin-lead alloy deposited by sputtering, or nickel, tin, lead, or tin-lead alloy deposited by electroplating and electro-less plating. Without this etch resistant barrier layer, the first few microns, typically 3 to 5 microns of the via posts themselves get etched away, resulting in the ends of the via posts being recessed with respect to the dielectric material. Although when the chip package is attached to a Printed Circuit Board PCB, recessed via posts require more solder or other connecting material to provide an electronic connection, the addition of a barrier layer increases the unit cost, and so is sometimes dispensed with.

Configurations of the present invention are expected to have better thermal performance to be thinner and to have lower unit costs than 2 layer chip scale packages (CSP) and have better electrical performance and to have an overall lower cost than Micro Lead Frames.

Figure 3:
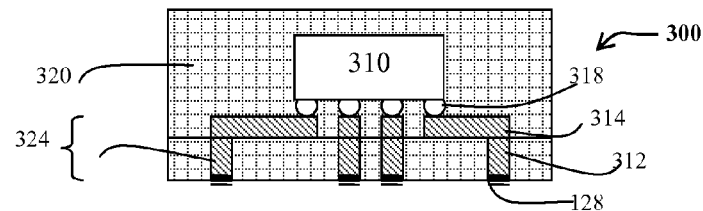
FIG. 3 is a simplified section through an electronic chip package in accordance with a third embodiment of the invention.

With reference to FIG. 3, a variant support structure 300 is shown, mutatis mutantis, wherein the chip 310 is mounted in a flip chip configuration and connected to the routing features 314 of the interposer 324, by a ball grid array 318. In this variant support structure the one or more chips 10 may be encapsulated using a glass fiber in polymer pre-preg 320 instead of a molding material 120.

Figure 4:
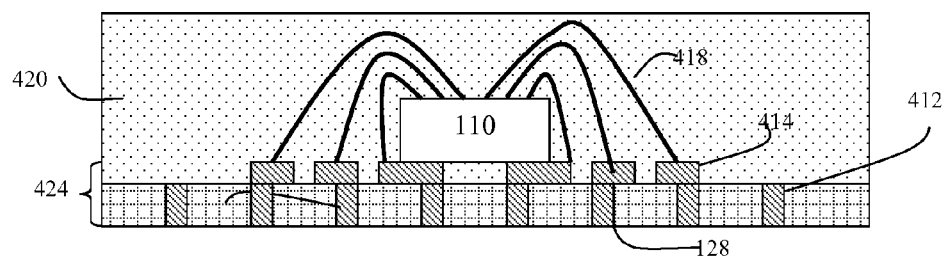
FIG. 4 is a simplified section through an electronic chip package in accordance with a fourth embodiment, showing an interposer that enables coupling a chip to a substrate by a Land Grid Array (LGA) or Ball Grid Array (BGA)

With further reference to FIG. 4, for coupling a chip 110 or a multichip array to a substrate in a fan-in arrangement, a Land Grid Array LGA or a ball grid array BGA may be used. The copper vias 412 are equally spaced in a rectangular grid, which, since a section is illustrated, one row thereof is shown as a line of equally spaced via posts 412. The routing layer 414 shortens the distances that the copper wires 418 need to span, and enable via posts 412 situated under the chip 110 to be utilized. In this manner, a chip may be wire bonded (or a flip chip may be coupled using an array of bumps) to an interposer 424 that is coupled to a land grid array.

In FIGS. 1 to 3, no solder mask is shown to keep the Figures simple. It will, however, be appreciated that solder mask may be used to isolate the ends of the routing layers.

Figure 5:
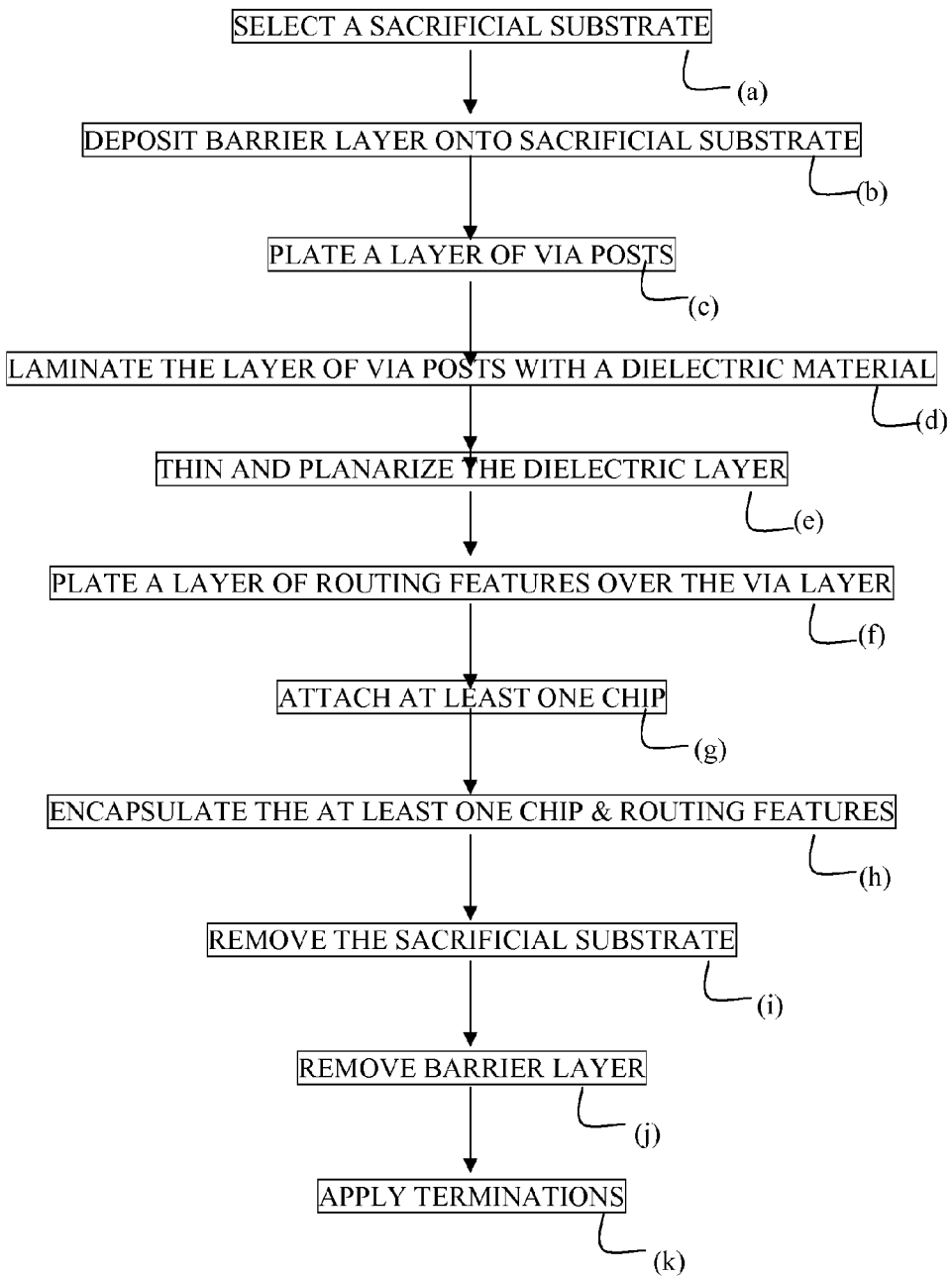
FIG. 5 is a flowchart showing how an electronic chip package described herein may be fabricated.

Referring to FIG. 5, a method of fabricating the electronic chip package comprises the following steps: selecting a sacrificial substrate 122—step (a). The substrate 122 is typically copper or a copper alloy, and may be simple copper plate or a commercially available peelable copper substrate 222 described below.

Then, an etchant resistant barrier layer 126 is deposited onto said sacrificial substrate—step (b). Typically the etchant resistant barrier layer is deposited to a thickness in the range of 0.1 micron to tens of microns, and may comprise tantalum, tungsten, titanium, titanium-tantalum alloy, titanium-tungsten alloy, nickel, tin, lead or tin-lead alloy deposited by sputtering, or nickel, tin, lead, or tin-lead alloy deposited by electroplating and electro-less plating.

A layer of via posts 112 is then plated over the barrier layer 126-step (c).

In one variant fabrication route, step (c) of plating a layer of via posts comprises pattern plating said layer of via posts by the sub-steps of:
(i) laying down a layer of photo-resist;
(ii) developing a pattern of vias 112 in said layer of photo-resist;
(iii) plating copper vias 112 into said pattern, and
(iv) stripping away the photo-resist leaving the vias posts 112 upstanding.

Optionally step (c) of plating a layer of via posts 112 comprises depositing a termination material 128 such as nickel, gold, tin, lead, tin-lead alloy, silver, palladium and alloys thereof into the pattern, and building via posts of copper onto the termination material by electroplating copper thereonto.

In another variant fabrication route step (c) of plating a layer of via posts comprises panel plating said layer of via posts by the sub-steps of:
panel plating a continuous layer of copper;
depositing a layer of photo-resist over said continuous layer of copper;
developing a pattern of vias in said layer of photo-resist;
etching away surplus copper to leave the upstanding via posts 112, and
stripping away the developed photo-resist leaving the via posts 112 upstanding.

It will be appreciated that unlike drill and fill techniques for creating vias which are characterized by the vias being substantially cylindrical and all vias being identical, in the manufacturing route of the present technology that uses plating, where via posts are either plated into a photoresist pattern, or where the surrounding material is etched away from a panel plated layer leaving the via posts, there is far greater flexibility in fabrication, and some or all of the via posts may themselves provide in plane routing. Such via posts may be strip like, and have one in-plane dimension that is significantly larger, perhaps three times or more, the other in-plane dimension.

The layer of via posts 112 is now laminated with a dielectric material 116—step (d). The dielectric material 116 may consist of Teflon, derivatives of Teflon, bismaleimide triazine resins, epoxy resins, polyimide resins, Polyphenylene Ether (PPE), Polythenylene Oxide (PPO) and mixtures and blends thereof.

Typically the dielectric material 116 further comprise at least one of:
(a) inorganic particulate fillers having mean particle size of between 0.5 microns and 30 microns and between 15% and 30% of particulate by weight;
(b) fibers selected from the list of organic fibers and glass fibers, arranged in an arrangement selected from the list of cross-plied arrangements, woven mats and randomly oriented chopped fibers.

In some embodiments, step (d) of laminating the layer of via posts 112 with a dielectric material 116 comprises applying a pre-preg comprising glass fibers in a matrix selected from the group comprising polyimide, epox-y or BT (Bismaleimide/Triazine), Polyphenylene Ether (PPE), Polythenylene Oxide or their blends, and curing by hot press laminating the pre-preg.

By laminating a prepreg over the via posts, the substrate can be stiff and warp resistant. The polymer chosen has good adhesion to the copper posts.

The dielectric layer 116 is now thinned and planarized to expose the ends of the via posts 112—step (e). In various processing routes, the thinning and planarizing of the dielectric layer is achieved by dry etching, mechanical grinding, chemical mechanical polishing CMP, combinations and two stage processes thereof.

Routing features 114 are now plated in a layer over the via post 112 layer—step (f).

The plating a layer of routing features 114 over the via post 112 layer may comprise either:
(i) panel plating copper over said dielectric layer, laying down a layer of photo-resist thereover, developing a positive pattern of routine features, selectively etching away superfluous copper leaving the routing features 114 and stripping away the photo-resist, or
(ii) laying down a layer of photo-resist, developing a pattern of trenches, pattern plating the routing features 112 into the trenches, and stripping away the photo-resist.

To aid adhesion of the routing features to the underlying dielectric material 116, an adhesion metal layer such as titanium, chrome or nickel/chrome alloy may be first deposited onto the thinned dielectric material and will typically have a thickness in the range of 0.04 microns to 0.1 microns. Copper is deposited thereover by first depositing a seed layer, typically by sputtering or electroless plating and then the copper layer is built up thereover by electroplating.

The chip 110 is now attached to the dielectric layer 116—step (g). In some embodiments, step (g) of attaching a chip 110 to the dielectric layer 116 comprises applying solder. This may be used for simple mechanical bonding, or, with reference to FIG. 3, in a flip chip configuration to electrically connect the chip 110 to the substrate with a ball grid array 318, (which cannot be done using a conventional lead frame).

With a flip chip setup using a ball grid array 318, the chip 110 and routing layer 312 may be laminated with a pre-preg 320 instead of using a traditional molding compound. This provides a thinner, stiffer product.

In other embodiments, as shown in FIGS. 1 and 2 the chip 110 is coupled to the interposer 124 by wire bonding the chip 10 to the routing features 114 by extending gold (or less commonly, aluminum or copper) wires 118 from the chip 10 to the routing features 114.

Due to the routing features, the length of wire 118 required may be less than that required for conventional lead frame arrangements. This significantly increases reliability of the chip package and generally decreases overall costs since less gold wire is required.

The chip 110, routing features 114 and wire bonds 118 are now encapsulated with molding compound 120—step (h). If a ball grid array (318 FIG. 3) is used to couple the flip-chip 310 to the interposer 324, a dielectric material with reinforcing fibers, such as a fiber matrix pre-preg 320 may be used. This has better stiffness properties than molding material 120, but cannot be used with wire bonding, since the glass fibers will break the gold wire bonds 118.

Using the chip 110 and the molding compound 120 (fiber reinforced dielectric 320) for stiffening the structure 100 (300), the sacrificial substrate 112 may be removed—step (i). This processing route of applying the chip 110 and molding material 120 before the sacrificial substrate 112 is removed is quite revolutionary as it requires either supplying an unfinished substrate to the packaging assembler, or the substrate assembler also adding the chip 110. Where a ball grid array is employed, using a dielectric prepreg 320 instead of a molding material 120 adds a further revolutionary development.

In some embodiments, step (i) of removal of the sacrificial substrate comprises peeling away the peelable copper substrate 222 and etching away the remaining copper foil.

In some embodiments, step (i) of etching away the sacrificial substrate 112/222 uses a wet etch process, and the etchant resistant barrier layer 126 fabricated in step (b), acts as an etch stop.

In one fabrication route, the barrier layer 126 fabricated in step (b) comprises tantalum and the etch process for step (i) of etching away the sacrificial substrate comprises exposing the sacrificial substrate to a solution of ammonium hydroxide at an elevated temperature. Alternatively, copper chloride may be used to as the etchant.

The barrier layer may then also be removed—step (j) with an appropriate etchant.

In one fabrication route, the etchant resistant barrier layer 126 fabricated in step (b) is selected from the group consisting of tantalum, titanium and tungsten, and step (k) of removing etchant resistant barrier layer comprises plasma etching uses a mixture of $CF_4$ and argon, wherein the mixture typically has a $CF_4$ to argon ratio of between 1:1 and 3:1. In another example, a method of etching away the barrier layer is by plasma etching using a $CF_4:O_2$ mix in the ratio of 93:7.

Once the sacrificial substrate 112 (222) is removed, if the etchant resistant barrier layer 126 is unsuitable for terminations, optionally the method further comprises removing the etchant resistant barrier layer 126—step (j) to expose the ends of the via posts 122, and applying terminations 128 to the ends of vias—step (k).

Where the etchant resistant barrier layer 126 is patterned before applying the copper vias by pattern plating, they may be used for termination purposes. In general, however, the method further comprises step (1) of applying a final coating to exposed ends of the vias 112 selected from the group consisting of nickel, gold, tin, lead, silver, palladium and alloys or amalgams thereof and organic anti-tarnish finishes.

An interposer consisting of a single via and routing layer 124 taken together is typically 25 to 40 microns thick and is not able to support itself. It may, however, be fabricated on a sacrificial substrate 112 (222), such as a copper plate that is 20 microns or so thick. Traditionally, interposers are supplied to chip packaging facilities in fully finished form. It is a feature of the present technology that either the interposer is provided to the chip packager on the substrate, or the substrate manufacturer attaches the chip 10 to the interposer 124 (324), vertically integrating and simplifying the manufacturing process.

As described above, the chip package 100 (300) contains a single die or chip 10, but it will be appreciated that two dies could be packaged together. For example, a memory chip and a controller could be positioned side by side on an interposer comprising a routing layer and via layer, electrically connected to the routing layer 312 via a ball grid array 318 or via wire bonds 118, or one chip 110 coupled with flip chip technology and the other with wire bonding, and then the chips 110 and routing layer 312 of the substrate 124 could be encapsulated with a molding compound, or if both chips are flip chips coupled to the interposer 324 by a ball grid array 318, could be encapsulated by laminating a pre-preg 320 thereover.

The new packaging technology described herein is compatible with Electroless Nickel/Electroless Palladium/Immersion Gold (ENEPIG) termination techniques.

Persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. An electronic chip package comprising at least one chip bonded to a routing layer of an interposer comprising a routing layer and a via post layer, wherein the via post layer includes via posts embedded in a dielectric material comprising glass fibers in a polymer resin, and the chip and routing layer are embedded in a second layer of dielectric material encapsulating the chip and the routing layers and wherein an underside of the interposer includes copper ends of via posts surrounded with the dielectric material such that the copper ends of the via posts are flush with the dielectric material.

2. The electronic chip package of claim 1 further comprising a metallic sacrificial base on an opposite side of the via post layer from the routing layer.

3. The electronic chip package of claim 1 wherein at least one via post in the via post layer has a non-cylindrical shape characterized by having a long dimension in the X-Y plane that is at least 3 times as long as the short dimension in the X-Y plane.

4. The electronic chip package of claim 1 wherein the at least one chip is configured as a flip-chip that is bonded by an array of bumps to the routing layer.

5. The electronic chip package of claim 4 wherein the second layer of dielectric is a glass fiber reinforced polymer.

6. The electronic chip package of claim 4 wherein the at least one chip is bonded to the routing layer by wire bonds and the second layer of dielectric is a molding compound.

7. The electronic chip package of claim 1, wherein the first layer of dielectric surrounding the via posts includes a first polymer resin and the second layer of dielectric material surrounding the routing layer and the at least one chip includes a second polymer resin, wherein the first polymer resin is different from the second polymer resin.

8. The electronic chip package of claim 1, wherein the first layer of dielectric surrounding the via posts includes inorganic fillers.

9. The electronic chip package of claim 1, wherein the polymer resin of the first layer of dielectric surrounding the via posts is selected from the group consisting of polyimide, epox-y, BT (Bismaleimide/Triazine), Polyphenylene Ether (PPE), Polyphenylene Oxide (PPO) and their blends.

10. An electronic chip package comprising at least one chip bonded to a routing layer of an interposer comprising a routing layer and a via post layer, wherein the via post layer includes via posts embedded in a dielectric material comprising glass fibers in a polymer resin, and the chip and routing layer are embedded in a second layer of dielectric material encapsulating the chip and the routing layers and wherein an underside of the interposer includes copper ends of via posts surrounded with the dielectric material such that the copper ends of the via posts are recessed by up to 5 microns with respect to the dielectric material.

11. The electronic chip package of claim 10 further comprising a metallic sacrificial base on an opposite side of the via post layer from the routing layer.

12. The electronic chip package of claim 10 wherein at least one via post in the via post layer has a non-cylindrical shape characterized by having a long dimension in the X-Y plane that is at least 3 times as long as the short dimension in the X-Y plane.

13. The electronic chip package of claim 10 wherein the at least one chip is configured as a flip-chip that is bonded by an array of bumps to the routing layer.

14. The electronic chip package of claim 13 wherein the second layer of dielectric is a glass fiber reinforced polymer.

15. The electronic chip package of claim 10 wherein the at least one chip is bonded to the routing layer by wire bonds and the second layer of dielectric is a molding compound.

16. The electronic chip package of claim 10, wherein the first layer of dielectric surrounding the via posts includes a first polymer resin and the second layer of dielectric material surrounding the routing layer and the at least one chip includes a second polymer resin, wherein the first polymer resin is different from the second polymer resin.

17. The electronic chip package of claim 10, wherein the first layer of dielectric surrounding the via posts includes inorganic fillers.

18. The electronic chip package of claim 10, wherein the polymer resin of the first layer of dielectric surrounding the via posts is selected from the group consisting of polyimide, epox-y, BT (Bismaleimide/Triazine), Polyphenylene Ether (PPE), Polyphenylene Oxide (PPO) and their blends.

19. An electronic chip package comprising at least one chip bonded to a routing layer of an interposer comprising a routing layer and a via post layer, wherein the via post layer includes via posts embedded in a dielectric material comprising glass fibers in a polymer resin, and the chip and routing layer are embedded in a second layer of dielectric material encapsulating the chip and the routing layers and wherein said via layer includes copper vias and a barrier metal layer covering ends distanced from the routing layer such that an underside of the interposer includess ends of via posts comprising barrier metal surrounded with the dielectric material such that the barrier metal ends of the via posts are flush with the dielectric material.

20. The electronic chip package of claim 19 further comprising a metallic sacrificial base on an opposite side of the via post layer from the routing layer.

21. The electronic chip package of claim 19 wherein at least one via post in the via post layer has a non-cylindrical shape characterized by having a long dimension in the X-Y plane that is at least 3 times as long as the short dimension in the X-Y plane.

22. The electronic chip package of claim 19 wherein said via barrier metal layer is selected from the group consisting of Nickel, Gold, Tin, Lead, Palladium, Silver and combinations thereof.

23. The electronic chip package of claim 19 wherein said via barrier metal layer has a thickness in a range of from 1 micron to 10 microns.

24. The electronic chip package of claim 19 wherein the at least one chip is configured as a flip-chip that is bonded by an array of bumps to the routing layer.

25. The electronic chip package of claim 24 wherein the second layer of dielectric is a glass fiber reinforced polymer.

26. The electronic chip package of claim 19 wherein the at least one chip is bonded to the routing layer by wire bonds and the second layer of dielectric is a molding compound.

27. The electronic chip package of claim 19, wherein the first layer of dielectric surrounding the via posts includes a first polymer resin and the second layer of dielectric material surrounding the routing layer and the at least one chip includes a second polymer resin, wherein the first polymer resin is different from the second polymer resin.

28. The electronic chip package of claim 19, wherein the first layer of dielectric surrounding the via posts includes inorganic fillers.

29. The electronic chip package of claim 19, wherein the polymer resin of the first layer of dielectric surrounding the via posts is selected from the group consisting of polyimide, epox-y, BT (Bismaleimide/Triazine), Polyphenylene Ether (PPE), Polyphenylene Oxide (PPO) and their blends.

\* \* \* \* \*